(12) United States Patent
Wei et al.

(10) Patent No.: US 9,570,292 B2
(45) Date of Patent: Feb. 14, 2017

(54) METHOD FOR MAKING AN EPITAXIAL STRUCTURE WITH CARBON NANOTUBE LAYER

(75) Inventors: Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 482 days.

(21) Appl. No.: 13/593,607

(22) Filed: Aug. 24, 2012

(65) Prior Publication Data

US 2013/0255566 A1 Oct. 3, 2013

(30) Foreign Application Priority Data

Mar. 28, 2012 (CN) .......................... 2012 1 0085276

(51) Int. Cl.
| | |
|---|---|
| *C30B 25/04* | (2006.01) |
| *H01L 21/02* | (2006.01) |
| *C30B 19/00* | (2006.01) |
| *C30B 23/04* | (2006.01) |
| *C30B 25/18* | (2006.01) |
| *C30B 29/40* | (2006.01) |

(52) U.S. Cl.
CPC ........... *H01L 21/0237* (2013.01); *C30B 19/00* (2013.01); *C30B 23/04* (2013.01); *C30B 25/04* (2013.01); *C30B 25/183* (2013.01); *C30B 29/40* (2013.01); *C30B 29/406* (2013.01); *H01L 21/0242* (2013.01); *H01L 21/0254* (2013.01); *H01L 21/02458* (2013.01); *H01L 21/02521* (2013.01); *H01L 21/02642* (2013.01); *H01L 21/02647* (2013.01)

(58) Field of Classification Search
CPC .......... C30B 25/00; C30B 25/02; C30B 25/04; C30B 25/18; C30B 25/183; C30B 23/00; C30B 23/02; C30B 23/04; C30B 29/00; C30B 29/10; C30B 29/40; C30B 29/406; H01L 21/0237; H01L 21/02458; H01L 21/02521; H01L 21/0254; H01L 21/02642; H01L 21/02647
USPC ....... 117/58, 84, 88, 90, 92, 94–95, 97, 106, 117/937, 952
See application file for complete search history.

(56) References Cited

U.S. PATENT DOCUMENTS

| | | | |
|---|---|---|---|
| 7,083,679 B2 * | 8/2006 | Kiyoku .................. | B82Y 20/00 117/101 |
| 8,309,051 B2 | 11/2012 | Yao et al. | |
| 2002/0182839 A1 | 12/2002 | Ogawa et al. | |

(Continued)

FOREIGN PATENT DOCUMENTS

| | | |
|---|---|---|
| CN | 101378104 | 3/2009 |
| CN | 102263171 | 11/2011 |

(Continued)

*Primary Examiner* — Kenneth A Bratland, Jr.
(74) *Attorney, Agent, or Firm* — Zhigang Ma

(57) ABSTRACT

A method for making an epitaxial structure includes the following steps. A substrate having an epitaxial growth surface is provided. A buffer layer is formed on the epitaxial growth surface. A carbon nanotube layer is placed on the buffer layer. A first epitaxial layer is epitaxially grown on the buffer layer. The substrate and the buffer layer are removed to expose a second epitaxial growth surface. A second epitaxial layer is epitaxially grown on the second epitaxial growth surface.

13 Claims, 12 Drawing Sheets

(56) References Cited

U.S. PATENT DOCUMENTS

| | | | |
|---|---|---|---|
| 2006/0046325 A1* | 3/2006 | Usui | C23C 16/01 438/21 |
| 2006/0266281 A1* | 11/2006 | Beaumont | C30B 25/02 117/84 |
| 2009/0239042 A1* | 9/2009 | Jain | B23K 26/0066 428/195.1 |
| 2010/0096727 A1* | 4/2010 | Hennig | H01L 21/0237 257/613 |
| 2010/0133569 A1* | 6/2010 | Li | B82Y 20/00 257/98 |
| 2010/0181896 A1 | 7/2010 | Lee et al. | |
| 2010/0327228 A1* | 12/2010 | Bando | C30B 25/02 252/301.4 R |
| 2011/0052477 A1 | 3/2011 | Yao et al. | |
| 2011/0097631 A1 | 4/2011 | Lee et al. | |
| 2012/0325139 A1 | 12/2012 | Wei et al. | |
| 2013/0255565 A1* | 10/2013 | Wei | H01L 21/0237 117/58 |

FOREIGN PATENT DOCUMENTS

| | | |
|---|---|---|
| JP | 2008-266064 | 11/2008 |
| JP | 2008266064 A * | 11/2008 |
| JP | 2010-232464 | 10/2010 |
| TW | 200833598 | 8/2008 |

* cited by examiner

METHOD FOR MAKING AN EPITAXIAL STRUCTURE WITH CARBON NANOTUBE LAYER

CROSS-REFERENCE TO RELATED APPLICATIONS

This application claims all benefits accruing under 35 U.S.C. §119 from China Patent Application No. 201210085276.5, filed on Mar. 28, 2012 in the China Intellectual Property Office, disclosure of which is incorporated herein by reference. This application is related to applications entitled, "METHOD FOR MAKING EPITAXIAL STRUCTURE", filed on Aug. 24, 2012, Ser. No. 13/593,602; "METHOD FOR MAKING LIGHT EMITTING DIODE", filed on Dec. 28, 2012, Ser. No. 13/729,224; "METHOD FOR MAKING LIGHT EMITTING DIODE", filed on Dec. 28, 2012, Ser. No. 13/729,268; "METHOD FOR MAKING EPITAXIAL BASE", filed on Oct. 9, 2012, Ser. No. 13/647,443; "EPITAXIAL BASE", filed on Oct. 9, 2012, Ser. No. 13/647,444; "EPITAXIAL STRUCTURE", filed on Oct. 9, 2012, Ser. No. 13/647,445.

BACKGROUND

1. Technical Field

The present disclosure relates to epitaxial structures and methods for making the same.

2. Description of Related Art

Light emitting devices such as light emitting diodes (LEDs) based on group III-V nitride semiconductors such as gallium nitride (GaN) have been in use in many applications.

Since wide GaN substrates cannot be produced, the LEDs have been produced on a heteroepitaxial substrate such as sapphire. The use of sapphire substrate is problematic due to lattice mismatch and thermal expansion mismatch between GaN and the sapphire substrate. One consequence of thermal expansion mismatch is straining of the GaN/sapphire substrate structure, which leads to cracking of the GaN/sapphire substrate and difficulty in fabricating devices with small feature sizes. A solution to cure the thermal expansion mismatch is to form a plurality of grooves on the surface of the sapphire substrate by lithography or by etching before growing the GaN layer. However, both the processes of lithography and etching are complex, high in cost, and may contaminate the sapphire substrate.

What is needed, therefore, is to provide a method for solving the problem discussed above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present epitaxial structures and methods for making the same.

Figure 1:
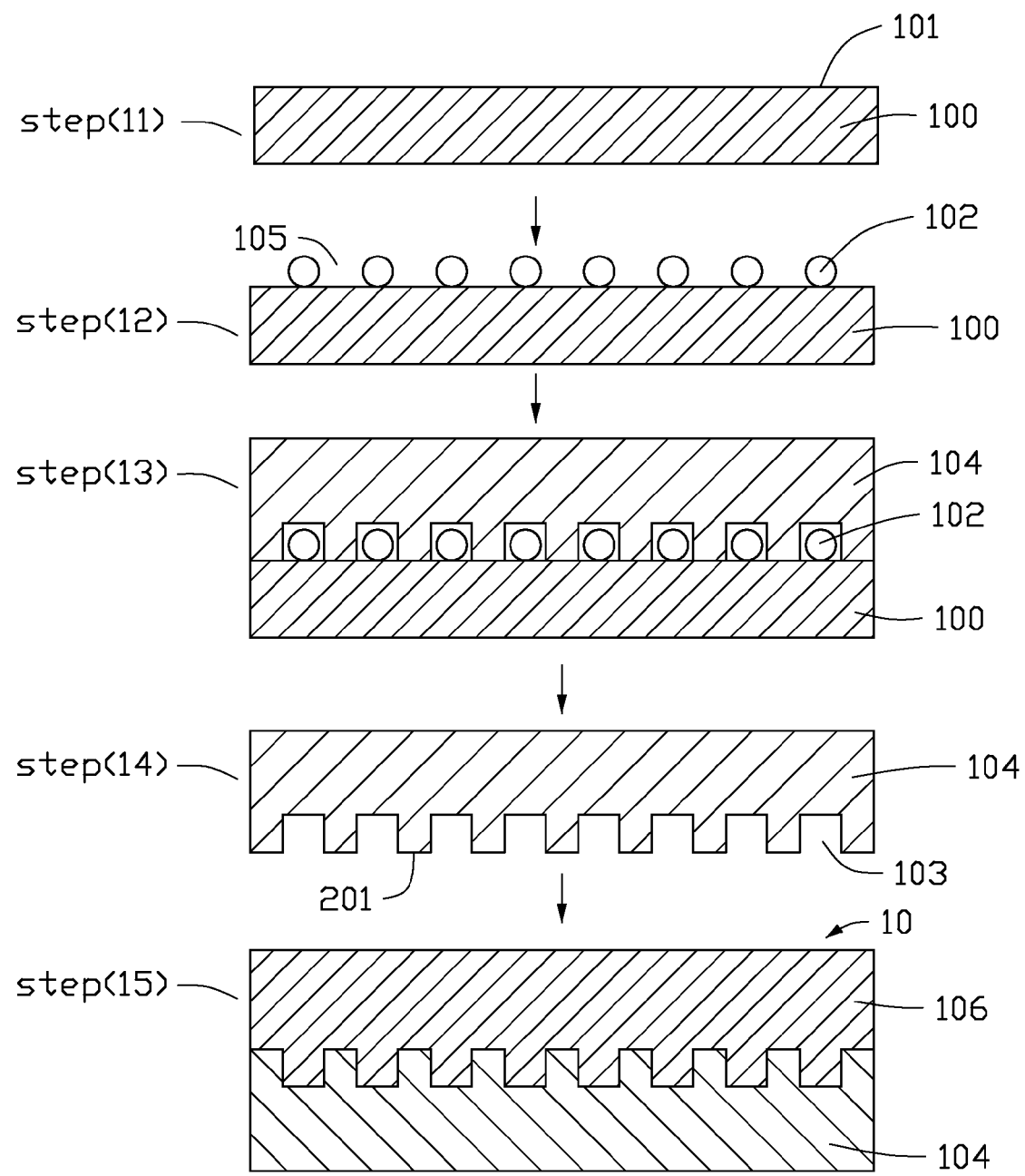
FIG. 1 is a flowchart of one embodiment of a method for making an epitaxial structure.

Referring to FIG. 1, a method for making an epitaxial structure 10 of one embodiment includes the following steps:

step (11), providing a substrate 100 having a first epitaxial growth surface 101;

step (12), placing a carbon nanotube layer 102 on the first epitaxial growth surface 101;

step (13), epitaxially growing a first epitaxial layer 104 on the first epitaxial growth surface 101;

step (14), exposing a second epitaxial growth surface 201 by removing the substrate 100 and the carbon nanotube layer 102; and step (15), growing a second epitaxial layer 106 on the second epitaxial growth surface 201.

In step (11), the first epitaxial growth surface 101 can be used to grow the first epitaxial layer 104. The first epitaxial growth surface 101 is a clean and smooth surface. The substrate 100 can be a single-layer structure or a multi-layer structure. If the substrate 100 is a single-layer structure, the substrate 100 can be a single crystal structure having a crystal face used as the first epitaxial growth surface 101. If the substrate 100 is a multi-layer structure, the substrate 100 should include at least one layer having the crystal face. The material of the substrate 100 can be GaAs, GaN, AlN, Si, SOI (silicon on insulator), SiC, MgO, ZnO, LiGaO$_2$, LiAlO$_2$, or Al$_2$O$_3$. The material of the substrate 100 can be selected according to the material of the first epitaxial layer 104. The first epitaxial layer 104 and the substrate 100 should have a small lattice mismatch and a thermal expansion mismatch. The size, thickness, and shape of the substrate 100 can be selected according to need. In one embodiment, the substrate 100 is a sapphire substrate.

In step (12), the carbon nanotube layer 102 is located on a surface of the first epitaxial growth surface 101. The carbon nanotube layer 102 and the first epitaxial growth surface 101 are in contact with each other. The carbon nanotube layer 102 includes a plurality of carbon nanotubes. The extending direction of the carbon nanotubes is parallel with the surface of the carbon nanotube layer 102 and the first epitaxial growth surface. The carbon nanotube layer 102 includes a plurality of apertures 105, and a portion of the buffer layer 1041 is exposed through the plurality of apertures 105.

The carbon nanotube layer 102 includes a plurality of carbon nanotubes. The carbon nanotubes in the carbon nanotube layer 102 can be single-walled, double-walled, or multi-walled carbon nanotubes. The length and diameter of the carbon nanotubes can be selected according to need. The thickness of the carbon nanotube layer 102 can be in a range from about 1 nanometer to about 100 micrometers. For example, the thickness of the carbon nanotube layer 102 can be about 10 nanometers, 100 nanometers, 200 nanometers, 1 micrometer, 10 micrometers, or 50 micrometers. The carbon nanotube layer 102 forms a pattern, therefore, part of the first epitaxial growth surface 101 can be exposed from the patterned carbon nanotube layer 102 after the carbon nanotube layer 102 is placed on the first epitaxial growth surface 101. Thus, the first epitaxial layer 104 can grow from the exposed buffer layer 1041.

The patterned carbon nanotube layer 102 defines the plurality of apertures 105. The plurality of apertures 105 can be dispersed uniformly. A first of the plurality of apertures 105 extends throughout the carbon nanotube layer 102 along the thickness direction thereof. Each of the plurality of apertures 105 can be a hole defined by several adjacent carbon nanotubes, or a gap defined by two substantially parallel carbon nanotubes and extending along axial direction of the carbon nanotubes. The plurality of apertures 105 which are hole-shaped and the plurality of apertures 105 which are gap-shaped can exist in the patterned carbon nanotube layer 102 at the same time. Hereafter, the size of each of the plurality of apertures 105 is the diameter of the hole or width of the gap. The sizes of the plurality of apertures 105 can be different. The average size of the plurality of apertures 105 can be in a range from about 10 nanometers to about 500 micrometers. For example, the sizes of the plurality of apertures 105 can be about 50 nanometers, 100 nanometers, 500 nanometers, 1 micrometer, 10 micrometers, 80 micrometers, or 120 micrometers. The smaller the sizes of the plurality of apertures 105, the less dislocation defects will occur during the process of growing the first epitaxial layer 104. In one embodiment, the sizes of the plurality of apertures 105 are in a range from about 10 nanometers to about 10 micrometers. A dutyfactor of the carbon nanotube layer 102 is an area ratio between the first epitaxial growth surface 101 which is sheltered and the buffer layer 1041 which is exposed. The dutyfactor of the carbon nanotube layer 102 can be in a range from about 1:100 to about 100:1. For example, the dutyfactor of the carbon nanotube layer 102 can be about 1:10, 1:2, 1:4, 4:1, 2:1, or 10:1. In one embodiment, the dutyfactor of the carbon nanotube layer 102 is in a range from about 1:4 to about 4:1.

The carbon nanotubes of the carbon nanotube layer 102 can be orderly arranged to form an ordered carbon nanotube structure or disorderly arranged to form a disordered carbon nanotube structure. The term 'disordered carbon nanotube structure' includes, but is not limited to, a structure wherein the carbon nanotubes are arranged along many different directions, and the aligning directions of the carbon nanotubes are random. The number of the carbon nanotubes arranged along each different direction can be almost the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure wherein the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes in the carbon nanotube layer 102 are arranged to extend along the direction substantially parallel to the surface of the carbon nanotube layer 102 so that it is easy to obtain a pattern having greater light transmission. After placement on the first epitaxial growth surface 101, the carbon nanotubes in the carbon nanotube layer 102 can be arranged to extend along the direction substantially parallel to the first epitaxial growth surface 101. The carbon nanotubes in the ordered carbon nanotube structure can also be arranged to extend along the crystallographic orientation of the substrate 100 or along a direction which forms an angle with the crystallographic orientation of the substrate 100.

The carbon nanotube layer 102 can be formed on the first epitaxial growth surface 101 by chemical vapor deposition (CVD), transfer printing a preformed carbon nanotube film, or filtering and depositing a carbon nanotube suspension. In one embodiment, the carbon nanotube layer 102 is a free-standing structure and can be drawn from a carbon nanotube array. The term "free-standing structure" means that the carbon nanotube layer 102 can sustain the weight of itself when it is hoisted by a portion thereof without any significant damage to its structural integrity. Thus, the carbon nanotube layer 102 can be suspended by two spaced supports. The carbon nanotube layer 102 which is free-standing can be laid on the first epitaxial growth surface 101 directly and easily.

The carbon nanotube layer 102 can be a substantially pure structure of carbon nanotubes, with few impurities and chemical functional groups. The carbon nanotube layer 102 can also be a composite including a carbon nanotube matrix and non-carbon nanotube materials. The non-carbon nanotube materials can be graphite, graphene, silicon carbide, boron nitride, silicon nitride, silicon dioxide, diamond, amorphous carbon, metal carbides, metal oxides, or metal nitrides. The non-carbon nanotube materials can be coated on the carbon nanotubes of the carbon nanotube layer 102. In one embodiment, the non-carbon nanotube materials are coated on the carbon nanotubes of the carbon nanotube layer 102 so that the carbon nanotubes can have greater diameters and the plurality of apertures 105 can be smaller. The non-carbon nanotube materials can be deposited on the carbon nanotubes of the carbon nanotube layer 102 by CVD or physical vapor deposition (PVD), such as sputtering.

Furthermore, the carbon nanotube layer 102 can be treated with an organic solvent after being placed on the first epitaxial growth surface 101 so that the carbon nanotube layer 102 can be attached on the first epitaxial growth surface 101 firmly. Specifically, the organic solvent can be applied to entire surface of the carbon nanotube layer 102 or an entirety of the carbon nanotube layer 102 can be immersed in an organic solvent. The organic solvent can be volatile, such as ethanol, methanol, acetone, dichloroethane, chloroform, or mixtures thereof. In one embodiment, the organic solvent is ethanol.

The carbon nanotube layer 102 can include at least one carbon nanotube film, at least one carbon nanotube wire, or combination thereof. In one embodiment, the carbon nanotube layer 102 can include a single carbon nanotube film or two or more carbon nanotube films stacked together. Thus, the thickness of the carbon nanotube layer 102 can be controlled by the number of the stacked carbon nanotube films. The number of the stacked carbon nanotube films can be in a range from about 2 to about 100. For example, the number of the stacked carbon nanotube films can be 10, 30, or 50. In one embodiment, the carbon nanotube layer 102 can include a layer of parallel and spaced carbon nanotube wires. Also, the carbon nanotube layer 102 can include a plurality of carbon nanotube wires crossed or weaved together to form a carbon nanotube net. The distance between two adjacent parallel and spaced carbon nanotube wires can be in a range from about 0.1 micrometers to about 200 micrometers. In one embodiment, the distance between two adjacent parallel and spaced carbon nanotube wires is in a range from about 10 micrometers to about 100 micrometers. The gap between two adjacent substantially parallel carbon nanotube wires is defined as one of the plurality of apertures 105. The size of each of the plurality of apertures 105 can be controlled by controlling the distance between two adjacent parallel and spaced carbon nanotube wires. The length of the gap between two adjacent parallel carbon nanotube wires can be equal to the length of the carbon nanotube wire. It is understood that any carbon nanotube structure described can be used with all embodiments.

Figure 2:
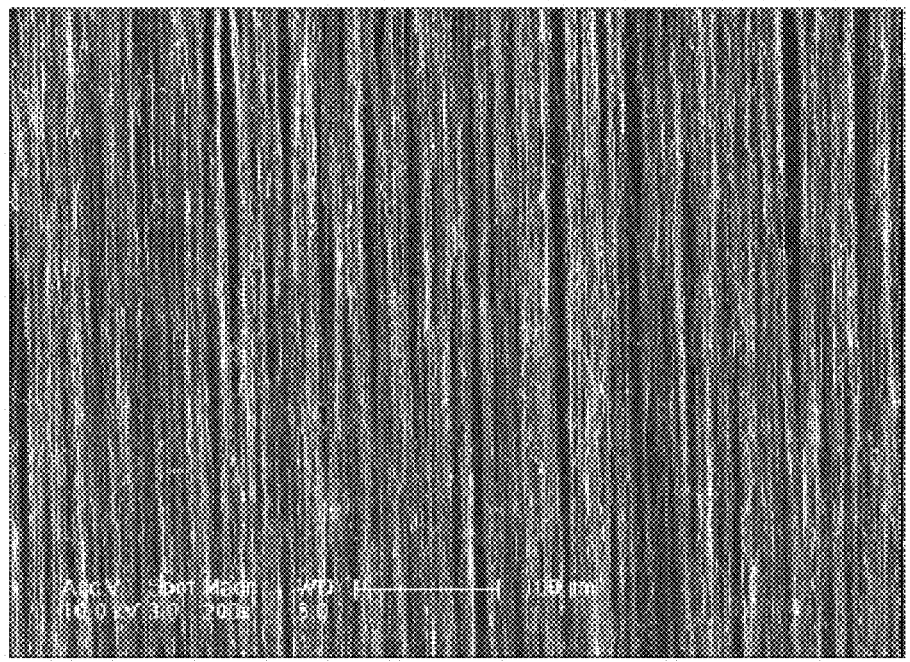
FIG. 2 is a Scanning Electron Microscope (SEM) image of a drawn carbon nanotube film.
Figure 3:
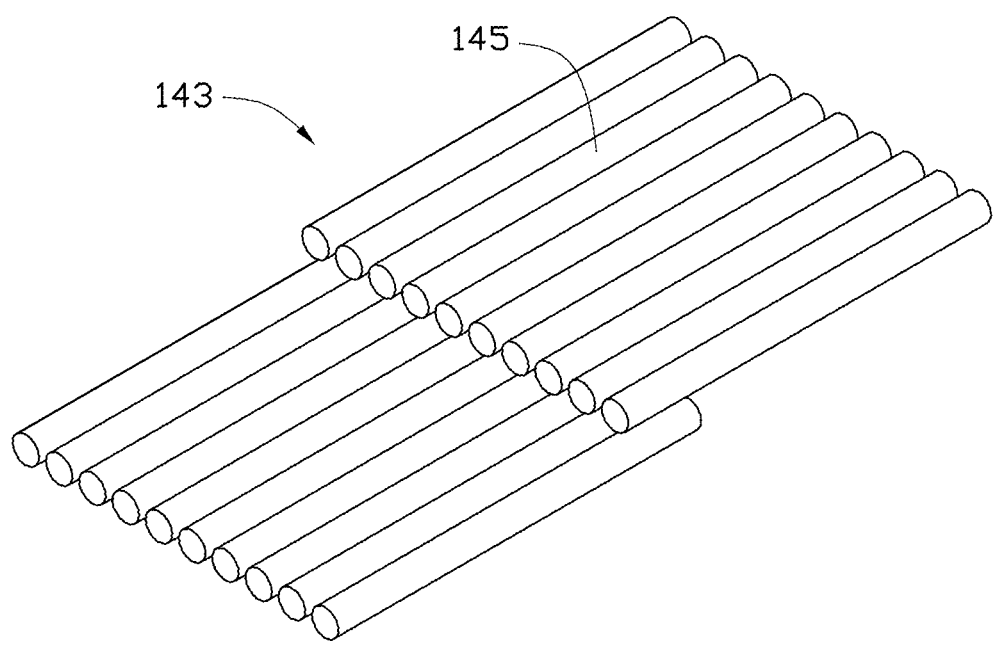
FIG. 3 is a schematic structural view of a carbon nanotube segment of the drawn carbon nanotube film of FIG. 2.

In one embodiment, the carbon nanotube layer 102 includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIGS. 2 to 3, each of the plurality of carbon nanotube segments 143 includes a plurality of carbon nanotubes 145 similarly oriented at an orientation direction and axially combined by van der Waals attractive force therebetween. Each drawn carbon nanotube film includes a plurality of carbon nanotube segments 143, wherein each of the plurality of carbon nanotube segments is successively oriented along the orientation direction, and wherein an end of one of the plurality of carbon nanotube segments is joined to an end of another one of the plurality of carbon nanotube segments by van der Waals attractive force therebetween. As can be seen in FIG. 2, some variations can occur in the drawn carbon nanotube film. The plurality of carbon nanotubes 145 in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nanometers to about 100 micrometers. The drawn carbon nanotube film can be attached to the first epitaxial growth surface 101 directly.

Figure 4:
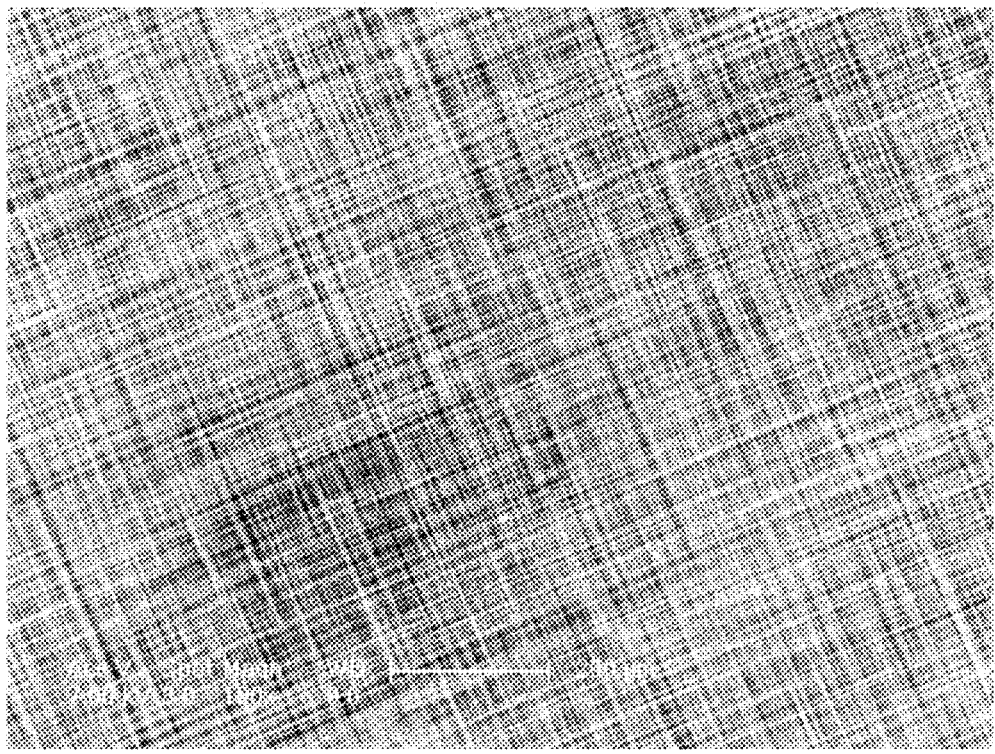
FIG. 4 is an SEM image of cross-stacked drawn carbon nanotube films.

Referring to FIG. 4, the carbon nanotube layer 102 can include at least two stacked drawn carbon nanotube films. In other embodiments, the carbon nanotube layer 102 can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked drawn carbon nanotube films is larger than 0 degrees, a plurality of micropores is defined by the carbon nanotube layer 102. Stacking the carbon nanotube films will also add to the structural integrity of the carbon nanotube layer 102.

A step of heating the drawn carbon nanotube film can be performed to decrease the thickness of the drawn carbon nanotube film. The drawn carbon nanotube film can be partially heated by a laser or microwave. The thickness of the drawn carbon nanotube film can be reduced because some of the carbon nanotubes will be oxidized. In one embodiment, the drawn carbon nanotube film is irradiated by a laser device in an atmosphere comprising of oxygen therein. The power density of the laser is greater than $0.1 \times 10^4$ watts per square meter. The drawn carbon nanotube film can be heated by fixing the drawn carbon nanotube film and moving the laser device at a substantially uniform speed to irradiate the drawn carbon nanotube film. When the laser irradiates the drawn carbon nanotube film, the laser is focused on the surface of the drawn carbon nanotube film to form a laser spot. The diameter of the laser spot ranges from about 1 micron to about 5 millimeters. In one embodiment, the laser device is carbon dioxide laser device. The power of the laser device is about 30 watts. The wavelength of the laser is about 10.6 micrometers. The diameter of the laser spot is about 3 millimeters. The velocity of the laser movement is less than 10 millimeters per second. The power density of the laser is $0.053 \times 10^{12}$ watts per square meter.

In another embodiment, the carbon nanotube layer 102 can include a pressed carbon nanotube film. The pressed carbon nanotube film can be a free-standing carbon nanotube film. The carbon nanotubes in the pressed carbon nanotube film are arranged along a same direction or arranged along different directions. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is about 0 degrees to approximately 15 degrees. The greater the pressure applied, the smaller the angle formed. If the carbon nanotubes in the pressed carbon nanotube film are arranged along different directions, the carbon nanotube layer 102 can be isotropic.

In another embodiment, the carbon nanotube layer 102 includes a flocculated carbon nanotube film. The flocculated carbon nanotube film can include a plurality of long, curved, disordered carbon nanotubes entangled with each other. Furthermore, the flocculated carbon nanotube film can be isotropic. The carbon nanotubes can be substantially uniformly dispersed in the carbon nanotube film. Adjacent carbon nanotubes are acted upon by van der Waals attractive force to form an entangled structure with micropores defined therein. Sizes of the micropores can be less than 10 micrometers. The porous nature of the flocculated carbon nanotube film will increase the specific surface area of the carbon nanotube layer 102. Further, due to the carbon nanotubes in the carbon nanotube layer 102 being entangled with each other, the carbon nanotube layer 102 employing the flocculated carbon nanotube film has excellent durability, and can be fashioned into desired shapes with a low risk to the integrity of the carbon nanotube layer 102. The flocculated carbon nanotube film, in some embodiments, is free-standing due to the carbon nanotubes being entangled and adhered together by van der Waals attractive force therebetween.

Figure 5:
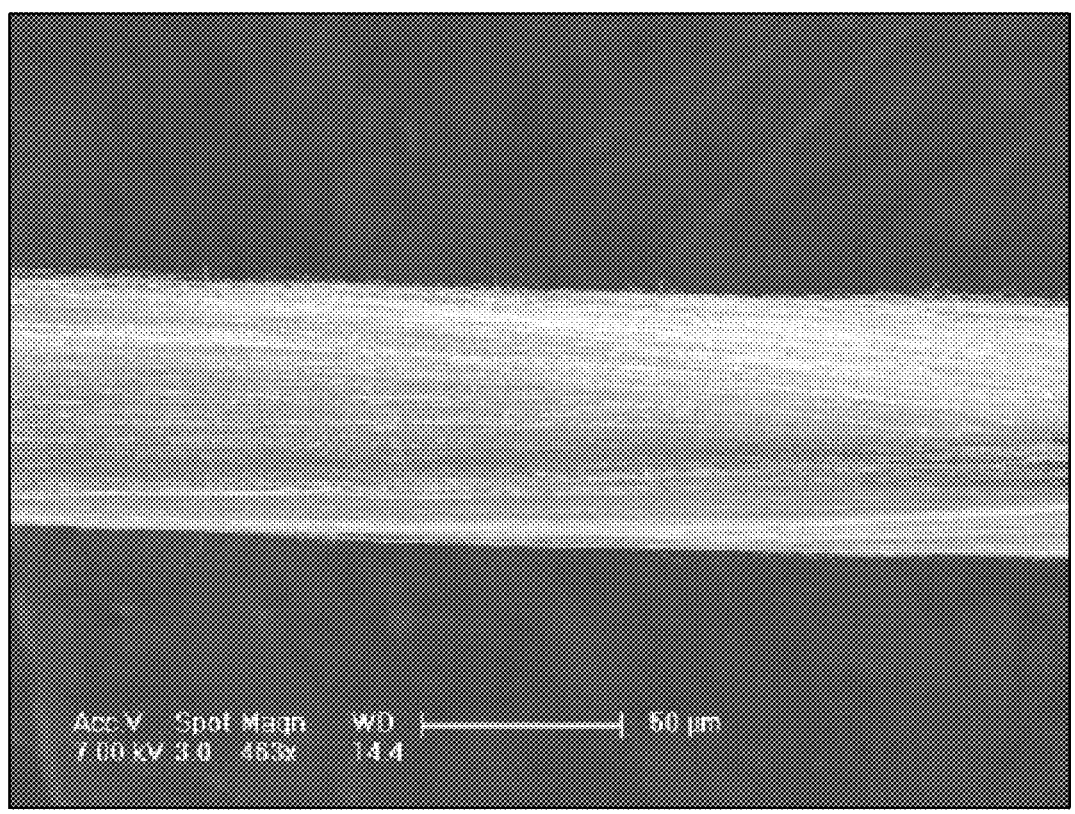
FIG. 5 is an SEM image of an untwisted carbon nanotube wire.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes, and thus, the drawn carbon nanotube film will be shrunk into an untwisted carbon nanotube wire. Referring to FIG. 5, the untwisted carbon nanotube wire includes a plurality of carbon nanotubes substantially oriented along a same direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the untwisted carbon nanotube wire can be arbitrarily set as desired. A diameter of the untwisted carbon nanotube wire ranges from about 0.5 nanometers to about 100 micrometers.

Figure 6:
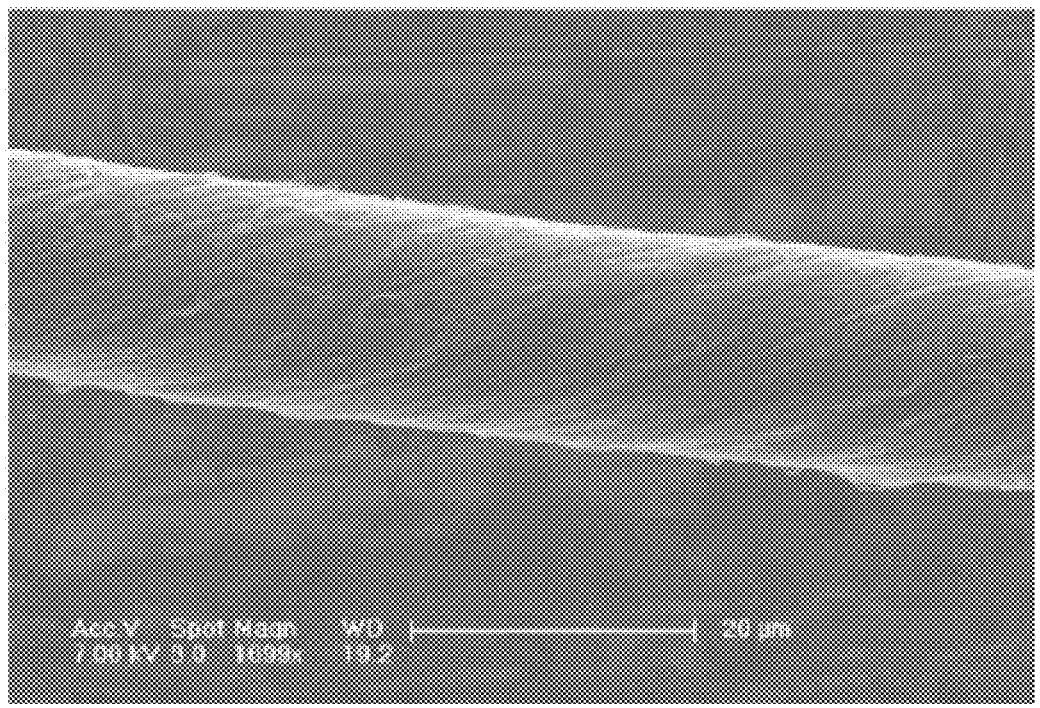
FIG. 6 is an SEM image of a twisted carbon nanotube wire.
Figure 7:
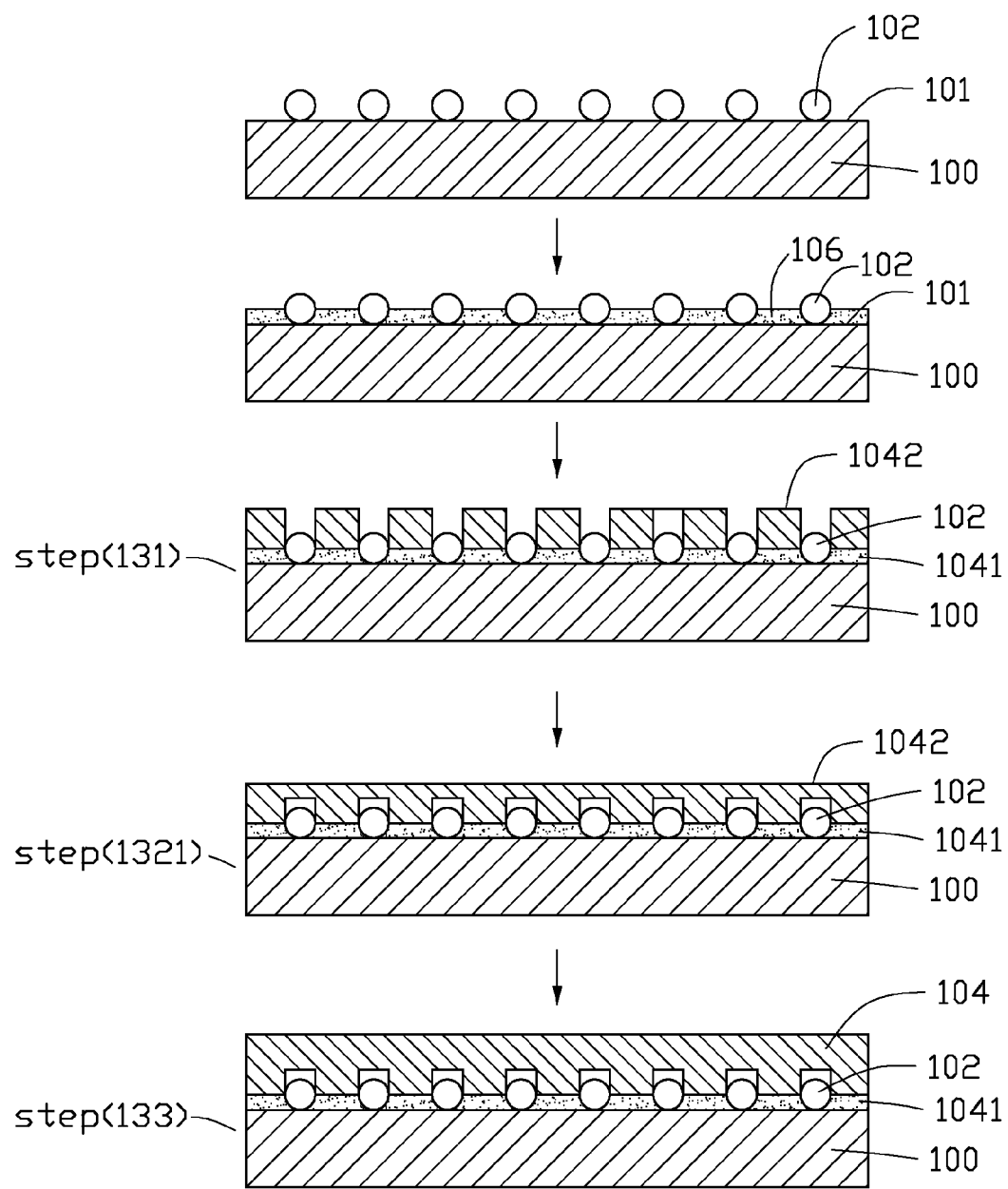
FIG. 7 is a process of growing a first epitaxial layer.

The twisted carbon nanotube wire can be formed by twisting a drawn carbon nanotube film using a mechanical force to turn the two ends of the drawn carbon nanotube film in opposite directions. Referring to FIG. 6, the twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. The length of the carbon nanotube wire can be set as desired. A diameter of the twisted carbon nanotube wire can be from about 0.5 nanometers to about 100 micrometers. Further, the twisted carbon nanotube wire can be treated with a volatile organic solvent after being twisted to bundle the adjacent paralleled carbon nanotubes together. The specific surface area of the twisted carbon nanotube wire will decrease, while the density and strength of the twisted carbon nanotube wire will increase.

The carbon nanotube layer 102 can be used as a mask for growing the first epitaxial layer 104. The mask is the carbon nanotube layer 102 sheltering a part of the first epitaxial growth surface 101 and exposing another part of the first epitaxial growth surface 101. Thus, the first epitaxial layer 104 can grow from the exposed first epitaxial growth surface 101. The carbon nanotube layer 102 can form a patterned mask on the first epitaxial growth surface 101 because the carbon nanotube layer 102 defines a plurality of apertures 105. Compared to lithography or etching, the method of forming the carbon nanotube layer 102 as mask is simple, low in cost, and will not contaminate the substrate 100.

It is can be understood that the substrate 100 and the carbon nanotube layer 102 form an epitaxial base to growth the first epitaxial layer 104 thereon.

In step (13), the first epitaxial layer 104 can be grown by a method such as molecular beam epitaxy, chemical beam epitaxy, reduced pressure epitaxy, low temperature epitaxy, select epitaxy, liquid phase deposition epitaxy, metal organic vapor phase epitaxy, ultra-high vacuum chemical vapor deposition, hydride vapor phase epitaxy, or metal organic chemical vapor deposition (MOCVD).

The material of the first epitaxial layer 104 can be semiconductor, metal or alloy. The semiconductor can be Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N. The metal can be aluminum, platinum, copper, or silver. The alloy can be MnGa, CoMnGa, or Co$_2$MnGa. The thickness of the first epitaxial layer 104 can be prepared according to need. The thickness of the first epitaxial layer 104 can be in a range from about 100 nanometers to about 500 micrometers. For example, the thickness of the first epitaxial layer 104 can be about 200 nanometers, 500 nanometers, 1 micrometer, 2 micrometers, 5 micrometers, 10 micrometers, or 50 micrometers.

The method of growing the first epitaxial layer 104 includes following substeps:

First, placing the substrate 100 with the carbon nanotube layer 102 thereon into a reaction chamber and heating the substrate 100 to about 1100° C. to about 1200° C., introducing the carrier gas, and baking the substrate 100 for about 200 seconds to about 1000 seconds;

Second, growing the buffer layer 1041 by reducing the temperature to a range from about 500° C. to 650° C. in the carrier gas atmosphere, and introducing the Ga source gas and the nitrogen source gas at the same time;

Third, stopping the flow of the Ga source gas in the carrier gas and nitrogen source gas atmosphere, increasing the temperature to a range from about 1100° C. to about 1200° C., and maintaining the temperature for about 30 seconds to about 300 seconds; and Fourth, growing the high quality first epitaxial layer 104 by maintaining the temperature of the substrate 100 in a range from about 1000° C. to about 1100° C., and introducing the Ga source gas again and the Ni source gas.

Figure 8:
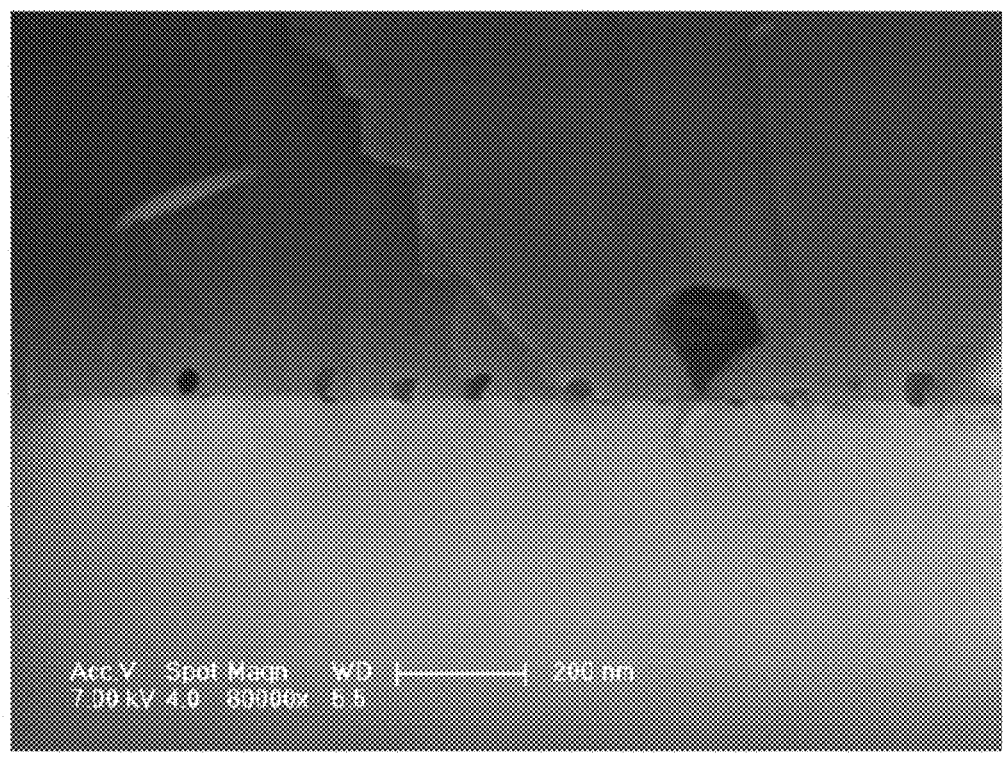
FIG. 8 is an SEM image of a cross-section of the first epitaxial structure of FIG. 7.
Figure 9:
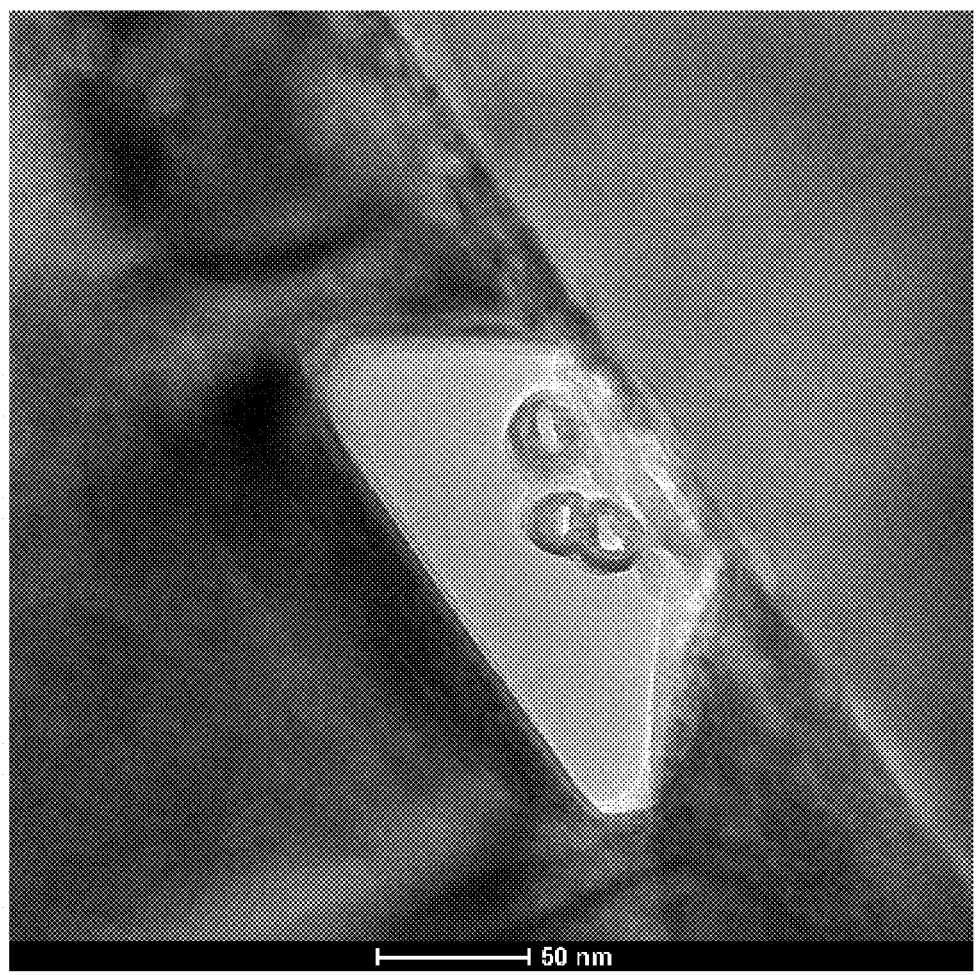
FIG. 9 is a transmission electron microscopy (TEM) image of a cross section of the first epitaxial structure of FIG. 7.

The thickness of the buffer layer 1041 is smaller than the thickness of the carbon nanotube layer 102. Referring to FIGS. 8 and 9, the dark-colored layer is the GaN epitaxial layer, and the light-colored layer is the sapphire substrate. A plurality of grooves is defined on the face of the GaN epitaxial layer. The grooves are covered by the sapphire substrate to form a plurality of tunnels. The carbon nanotubes are located in the tunnels.

In detail, the first epitaxial layer 104 is formed by following substeps:

step (131), nucleating on the buffer layer 1041 and growing a plurality of epitaxial crystal grains 1042 along the direction substantially perpendicular to the surface of the buffer layer 1041;

step (132), forming a continuous epitaxial film 1044 by making the plurality of epitaxial crystal grains 1042 grow along the direction substantially parallel to the surface of the buffer layer 1041; and step (133), forming the first epitaxial layer 104 by making the epitaxial film 1044 grow along the direction substantially perpendicular to the surface of the buffer layer 1041.

In step (131), the epitaxial crystal grains grow from the exposed part of the buffer layer 1041 and through the first of the plurality of apertures 105. The process of the epitaxial crystal grains growing along the direction substantially perpendicular to the buffer layer 1041 is called vertical epitaxial growth.

In step (132), the epitaxial crystal grains are joined together to form an integral structure (the epitaxial film) to cover the carbon nanotube layer 102. The epitaxial crystal grains grow and form a plurality of grooves 103 to enclose the carbon nanotubes of the carbon nanotube layer 102. The inner wall of the plurality of grooves 103 can be in contact with the carbon nanotubes or spaced from the carbon nanotubes, depending on whether the material of the epitaxial film and the carbon nanotubes have mutual infiltration. Thus, the epitaxial film defines a patterned depression on the surface adjacent to the buffer layer 1041. The patterned depression is related to the patterned carbon nanotube layer 102. If the carbon nanotube layer 102 includes a layer of parallel and spaced carbon nanotube wires, the patterned depression is a plurality of parallel and spaced grooves. If the carbon nanotube layer 102 includes a plurality of carbon nanotube wires crossed or weaved together to form a carbon nanotube net, the patterned depression is a groove network including a plurality of intersected grooves. The carbon nanotube layer 102 can further prevent lattice dislocation between the epitaxial crystal grains and the substrate 100 from growing. The process of epitaxial crystal grains growing along the direction substantially parallel to the epitaxial growth surface 101 is called lateral epitaxial growth.

In step (133), the first epitaxial layer 104 is obtained by growing for a long duration of time. Because the carbon nanotube layer 102 can prevent the lattice dislocation between the epitaxial crystal grains and the buffer layer 1041 from growing in step (132), the first epitaxial layer 104 has fewer defects therein.

In step (14), the substrate 100 and carbon nanotube layer 102 can be removed by laser irradiation, corrosion, or thermal expansion and contraction. The method of removing the substrate 100 and the carbon nanotube layer 102 depends on the material of the material of the substrate 100 and the material of the first epitaxial layer 104.

Figure 12:
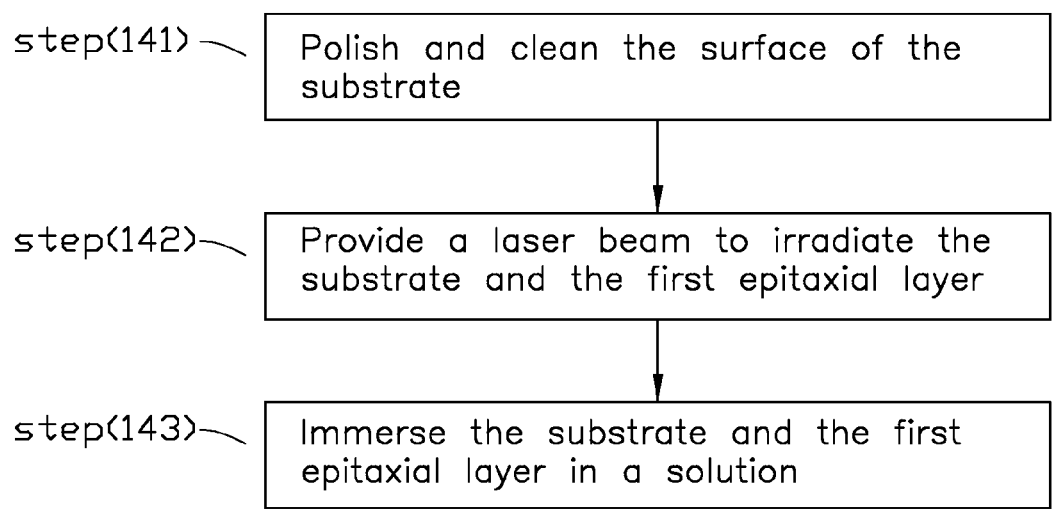
FIG. 12 is a flowchart of one embodiment of a method of removing substrate.

In one embodiment, the substrate 100 is sapphire, and the first epitaxial layer 104 is a high-temperature GaN layer. Referring to FIG. 12, the substrate 100 is removed by laser irradiation and the step (14) includes the following substeps:

step (141), polishing and cleaning the surface of the substrate 100;

step (142), providing a laser beam to irradiate the substrate 100 and the first epitaxial layer 104; and step (143), immersing the substrate 100 and the first epitaxial layer 104 in a solution.

In step (141), the surface of the substrate 100 can be polished by a mechanical polishing or chemical polishing so the substrate 100 has a smooth surface to reduce the scattering in laser irradiation. The surface of the substrate 100 can be cleaned using hydrochloric acid or sulfuric acid to remove the metal impurities and/or oil dirt thereon.

In step (142), the substrate 100 is placed on a flat support in a vacuum or protective gas to prevent the carbon nanotube layer 102 from oxidation. The protective gas can be nitrogen gas, helium gas, argon gas, or other inert gases.

The laser beam irradiates the polished surface of the substrate 100 substantially perpendicular to the polished surface. Thus, the laser beam can irradiate the interface between the substrate 100 and the first epitaxial layer 104. The wavelength of the laser beam can be selected according to the material of the buffer layer 1041 and the substrate 100 so the energy of the laser beam is less than the band-gap energy of the substrate 100 and greater than the band-gap energy of the buffer layer 1041. Thus, the laser beam can get through the substrate 100 to arrive at the buffer layer 1041. The buffer layer 1041 can absorb the laser beam and be heated to decompose rapidly. In one embodiment, the buffer layer 1041 is a low-temperature GaN layer with a band-gap energy of 3.3 electron volts, the substrate 100 is sapphire with a band-gap energy of 9.9 electron volts, and the laser beam has a wavelength of 248 nanometers, an energy of 5 electron volts, an impulse duration from about 20 ns to about 40 ns, and an energy density from about 0.4 joules per square centimeter to about 0.6 joules per square centimeter. The shape of the laser spot is square with a side length of about 0.5 millimeters. The laser spot can move relative to the substrate 100 with a speed of about 0.5 millimeters per second. After absorption of the laser beam, the low-temperature GaN buffer layer 1041 can decompose to Ga and $N_2$. The substrate 100 will not be damaged because only a small amount of the laser beam is absorbed.

In step (143), the substrate 100 and the first epitaxial layer 104 are immersed in an acid solution to remove the Ga decomposed from the GaN buffer layer 1041, so the substrate 100 is separated from the first epitaxial layer 104. Furthermore, the carbon nanotube layer which attached on the substrate 100 is removed. The acid solution can be a hydrochloric acid, sulfuric acid, or nitric acid that can dissolve the Ga. Because the buffer layer 1041 is decomposed by laser irradiation and removed by immersing in acid solution, the carbon nanotube layer 102 will be removed with the buffer layer 1041. Because the carbon nanotube layer 102 allows the first epitaxial layer 104 and the substrate 100 to have a relative small contacting surface, the substrate 100 can be separated from the first epitaxial layer 104 easily and the damage on the first epitaxial layer 104 will be reduced.

After the substrate 100 and the carbon nanotube layer 102 are removed, the plurality of grooves 103 is exposed from the surface of the first epitaxial layer 104. Thus the surface of the first epitaxial layer 104 forms a patterned surface. The patterned surface is used as the second epitaxial growth surface 201 to grow the second epitaxial layer 106.

Figure 10:
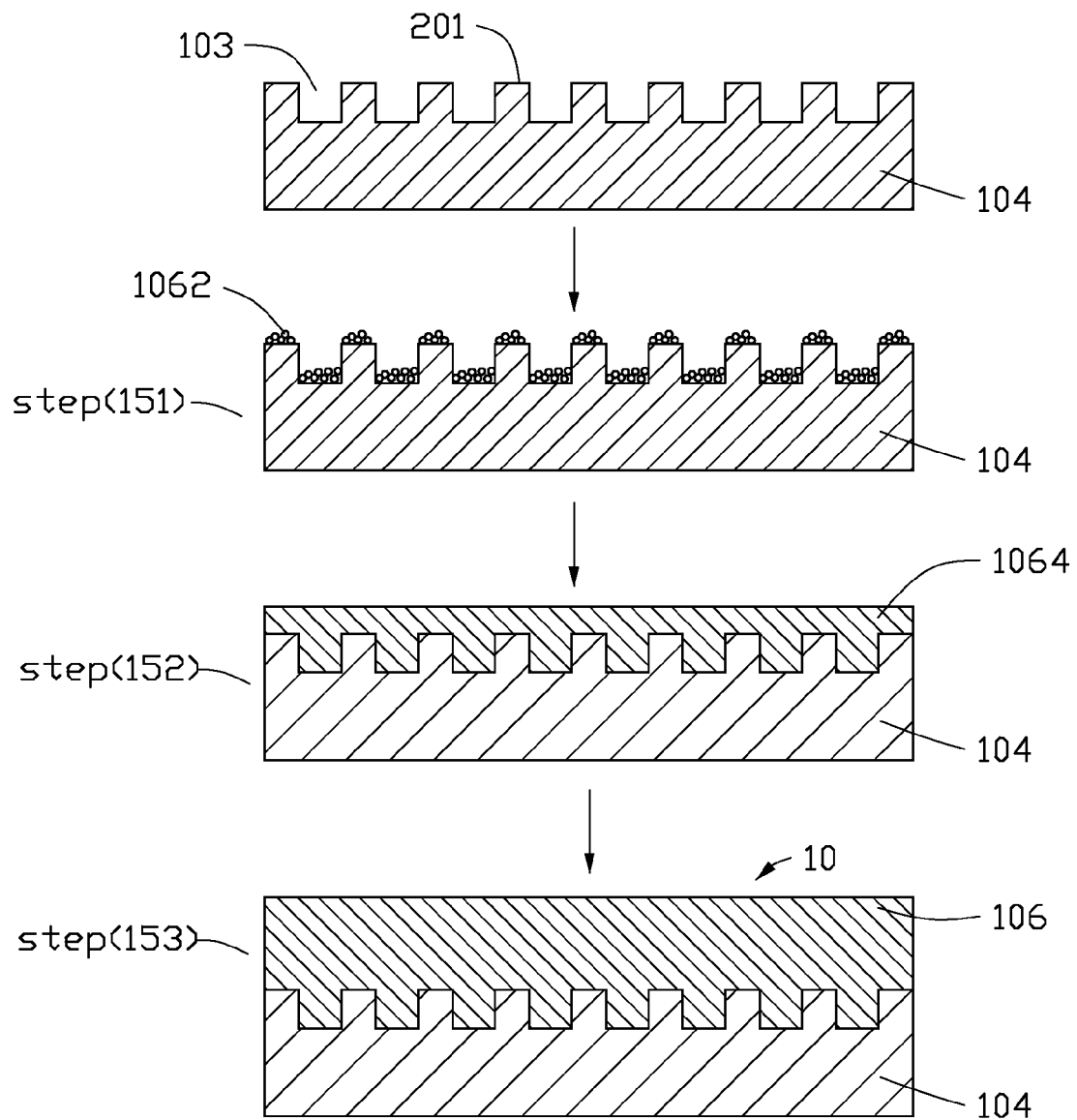
FIG. 10 is a process of growing a second epitaxial layer.

Referring to FIG. 10, in step (15), the method of growing the second epitaxial layer 106 is similar with the method of growing the first epitaxial layer 104. Furthermore, another buffer layer (not shown) can be grown on the second epitaxial growth surface 201. In one embodiment, the material of the second epitaxial layer 106 is same as that of the first epitaxial layer 104. The second epitaxial layer 106 is grown on the second epitaxial growth surface 201. The method of growing the second epitaxial layer 106 includes following substeps:

step (151), nucleating on the second epitaxial growth surface 201 and growing a plurality of epitaxial crystal grains 1062 along the direction substantially perpendicular to the second epitaxial growth surface 201;

step (152), forming a continuous epitaxial film 1064 by making the plurality of epitaxial crystal grains 1062 grow along the direction substantially parallel to the second epitaxial growth surface 201; and step (153), forming the second epitaxial growth layer 106 by making the epitaxial film grow along the direction substantially perpendicular to the second epitaxial growth surface 201.

In step (151), the epitaxial crystal grains 1062 can be grown on the exposed second epitaxial growth surface 201. The growth speed of the epitaxial crystal grains 1062 according to the grooves 103 is greater than that of other part surface. Thus the epitaxial grains 1062 will be full filled in the grooves 103 and form a planar surface.

In step (152), the plurality of epitaxial crystal grains 1062 can grow along the direction parallel to the second epitaxial growth surface 201. The plurality of epitaxial crystal grains 1062 are gradually joined together to form the epitaxial film 1064 to cover the carbon nanotube layer 102 and the second epitaxial growth surface 201.

In step (153), the epitaxial film 1064 keep growing to form the second epitaxial layer 106. The thickness of the second epitaxial layer 106 can be in a range from about 100 nanometers to about 500 micrometers. For example, the thickness of the first epitaxial layer 104 can be about 200 nanometers, 500 nanometers, 1 micrometer, 2 micrometers, 5 micrometers, 10 micrometers, or 50 micrometers. The material and the thickness of the second epitaxial layer 106 can be selected according need. While the material of the second epitaxial layer 106 is same as that of the first epitaxial layer 104, the growth method is called the homogeneous epitaxial growth. While the material of the second epitaxial layer 106 is different from that of the first epitaxial layer 104, the growth method is called the heteroepitaxial epitaxial growth.

Furthermore, a second carbon nanotube layer (not shown) can be located on the second epitaxial growth surface 201 before the growth of the second epitaxial layer 106. The second carbon nanotube layer can be same as the carbon nanotube layer 102. The second carbon nanotube layer can also reduce the lattice mismatch.

Figure 11:
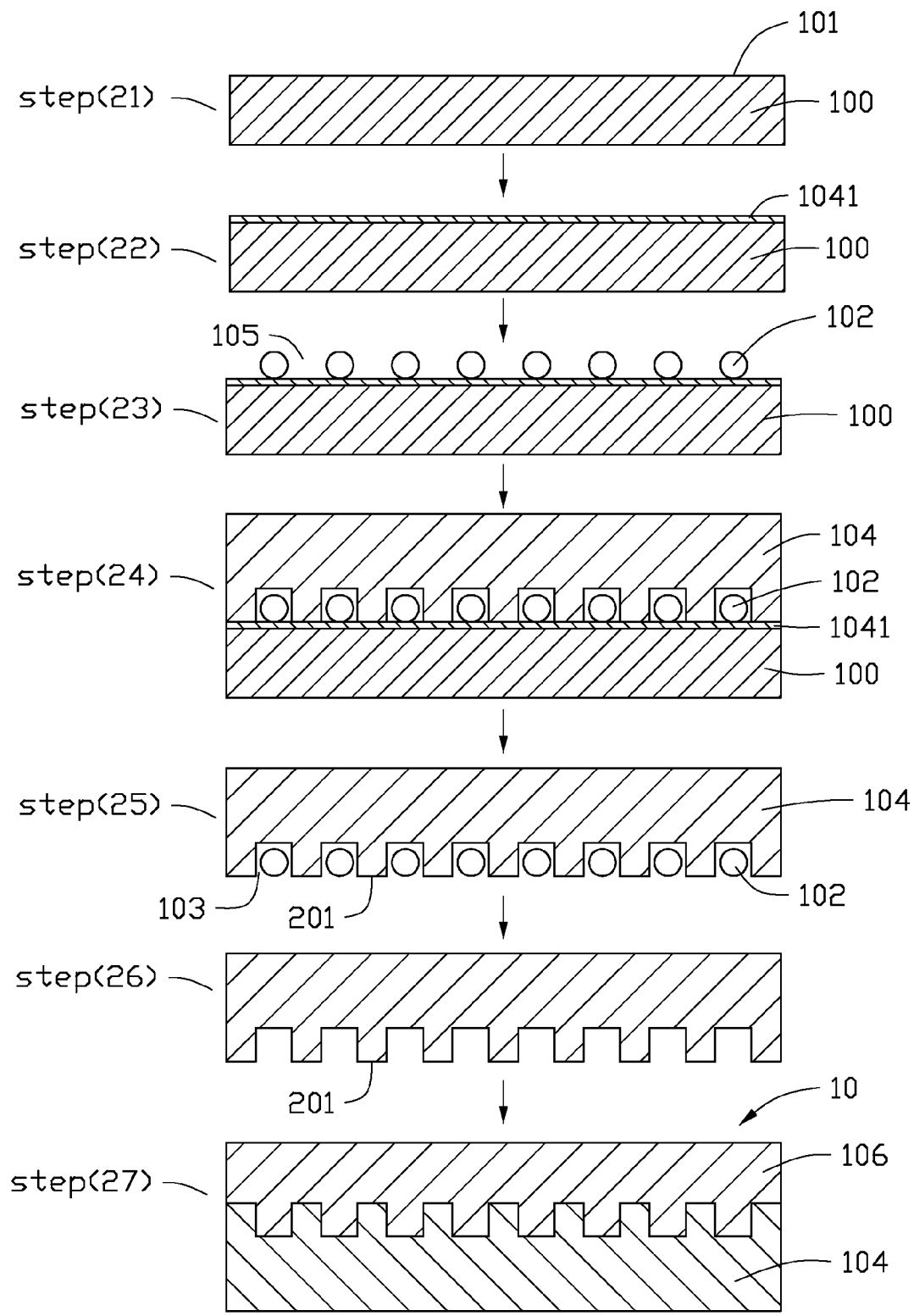
FIG. 11 is a flowchart of one embodiment of a method for making an epitaxial structure.

Referring to FIG. 11, a method for making an epitaxial structure 20 of one embodiment includes the following steps:

step (21), providing a substrate 100 having a first epitaxial growth surface 101;

step (22), growing a buffer layer 1041 on the first epitaxial growth surface 101;

step (23), placing a carbon nanotube layer 102 on the buffer layer 1041;

step (24), epitaxially growing a first epitaxial layer 104 on the buffer layer 1041;

step (25), exposing the carbon nanotube layer 102 by removing the buffer layer 1041 and the substrate 100;

step (26) forming a second epitaxial growth surface 201 by removing the carbon nanotube layer 102; and step (27), growing a second epitaxial layer 106 on the second epitaxial growth surface 201.

The method of making the epitaxial structure 20 is similar with that of the epitaxial structure 10, except that the buffer layer 1041 is grown on the epitaxial growth surface 101 before placing the carbon nanotube layer 102, and the carbon nanotube layer 102 is located on the buffer layer 1041

In step (26), the carbon nanotube layer 102 can be removed by plasma etching, laser heating, or furnace heating. In one embodiment, the carbon nanotube layer 102 is removed by laser heating includes the following substeps:

step (261), placing the first epitaxial layer 104 with the carbon nanotube layer 102 in an oxygen environment; and step (262), providing a laser beam to irradiate the carbon nanotube layer 102.

In step (261), the laser beam can be provided by a laser device such as a solid laser device, a liquid laser device, a gas laser device, or a semiconductor laser device. In one embodiment, the laser device is a carbon dioxide laser device. The power of the laser device is about 30 watts. The wavelength of the laser is about 10.6 micrometers. The diameter of the laser spot is about 3 millimeters. The power density of the laser is about $0.053 \times 10^{12}$ watts per square meter. The irradiating time is less than 1.8 second.

The parameter of the laser should be selected according to the material of the first epitaxial layer 104 so that the first epitaxial layer 104 will not decompose.

In step (262), the carbon nanotube layer 102 can absorb the laser and oxidize easily. The laser beam can be irradiated on the carbon nanotube layer 102 and moved relative to the carbon nanotube layer 102. The laser beam can be moved along a direction parallel with or perpendicular with the aligning direction of the carbon nanotubes in the carbon nanotube layer 102. The slower the laser beam moves relative to the epitaxial structure preform, more energy will be absorbed by the carbon nanotube layer 102, and the shorter time the carbon nanotube layer 102 will oxidize. In one embodiment, the speed of the laser beam moving relative to the epitaxial structure preform is less than 10 millimeters per second. Also, step (262) can be performed by fixing the laser beam and moving the carbon nanotube layer 102 so the carbon nanotube layer 102 is irradiated by the laser beam.

The method for making the epitaxial structure has many advantages. First, the carbon nanotube layer is a continuous and free-standing structure, and it can be directly placed on the substrate to grow the epitaxial layer, so the complex sputtering process is avoided. Second, because the apertures in the carbon nanotube layer are very small, the dislocation defects of the first epitaxial layer will be reduced. Lastly, because the carbon nanotubes can form a patterned surface in the first epitaxial layer, and the patterned surface is used as the second epitaxial growth surface, thus the dislocation defects will be further reduced in the process of growing the second epitaxial layer.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making an epitaxial structure, the method comprising:

directly placing a carbon nanotube layer on a first epitaxial growth surface of a substrate, wherein the carbon nanotube layer is a free-standing and continuous structure and comprises a plurality of carbon nanotubes parallel with a surface of the carbon nanotube layer; the carbon nanotube layer defines a plurality of apertures, and a size of each of the plurality of apertures ranges from 10 nanometers to 1 micrometer; and a thickness of the carbon nanotube layer ranges from 1 nanometer to 10 nanometers;

epitaxially growing a first epitaxial layer on the first epitaxial growth surface having the carbon nanotube layer, wherein the epitaxial layer defines a plurality of grooves to accommodate the carbon nanotube layer, and the carbon nanotube layer is spaced from an inner wall of the plurality of grooves;

forming a second epitaxial growth surface as a surface of the first epitaxial layer facing the carbon nanotube layer by removing the substrate and the carbon nanotube layer, wherein the substrate and the carbon nanotube layer are removed by:

providing a laser beam to irradiate an interface between the substrate and the first epitaxial layer, wherein a portion of the first epitaxial layer is decomposed, the first carbon nanotube layer is attached on the substrate, and both the carbon nanotube layer and the substrate remain on the first epitaxial layer;

immersing the substrate and the first epitaxial layer in an acid solution, wherein the substrate and the carbon nanotube layer are removed from the first epitaxial layer in the acid solution; and growing a second epitaxial layer on the second epitaxial growth surface.

2. The method of claim 1, wherein and the first epitaxial layer is grown on a part of the first epitaxial growth surface which is exposed and through the plurality of apertures.

3. The method of claim 2, wherein a dutyfactor of the carbon nanotube layer is in a range from about 1:4 to about 4:1.

4. The method of claim 2, wherein the step of epitaxially growing the first epitaxial layer on the first epitaxial growth surface comprises:

nucleating and growing a plurality of epitaxial crystal grains on the first epitaxial growth surface along a direction substantially perpendicular to the first epitaxial growth surface;

forming a continuous epitaxial film by growing the plurality of epitaxial crystal grains along a direction substantially parallel to the first epitaxial growth surface; and growing the epitaxial film along the direction substantially perpendicular to the first epitaxial growth surface to form the first epitaxial layer.

5. The method of claim 4, wherein the plurality of epitaxial crystal grains are grown to form the plurality of grooves so that the continuous epitaxial film defines a patterned depression on an interface between the first epitaxial growth surface and the continuous epitaxial surface.

6. The method of claim 5, wherein the carbon nanotube layer comprises a layer of carbon nanotube wires substantially parallel spaced, and the patterned depression comprises a plurality of substantially parallel spaced grooves.

7. The method of claim 5, wherein the carbon nanotube layer comprises a plurality of carbon nanotube wires crossed or weaved together to form a carbon nanotube net, and the patterned depression comprises a groove network comprising a plurality of intersected grooves.

8. The method of claim 1, wherein the carbon nanotube layer comprises a plurality of carbon nanotubes extending along a direction substantially parallel to the first epitaxial growth surface.

9. The method of claim 1, further comprising a step of locating a second carbon nanotube layer on the second growth surface before growing the second epitaxial layer.

10. The method of claim 1, wherein the carbon nanotube layer comprises a plurality of carbon nanotubes and non-carbon nanotube materials coated on the plurality of carbon nanotubes.

11. The method of claim 10, wherein the non-carbon nanotube materials is selected from the group consisting of silicon carbide, boron nitride, silicon nitride, silicon dioxide, metal carbides, metal oxides, and metal nitrides.

12. The method of claim 1, wherein the carbon nanotube layer comprises a plurality of carbon nanotubes combined together to form a structural integrity.

13. A method for making an epitaxial structure, the method comprising:

providing a substrate having a first epitaxial growth surface;

directly placing a first carbon nanotube layer on the epitaxial growth surface, wherein the carbon nanotube layer comprises a plurality of carbon nanotubes parallel with a surface of the carbon nanotube layer;

epitaxially growing a first epitaxial layer on the first epitaxial growth surface, wherein the epitaxial layer defines a plurality of grooves to accommodate the carbon nanotube layer;

decomposing a surface of the first epitaxial layer adjacent to the substrate by irradiating an interface between the substrate and the first epitaxial layer via a laser beam, wherein both the carbon nanotube layer and the substrate remain on the first epitaxial layer;

forming a second epitaxial growth surface by immersing the substrate, the carbon nanotube layer, and the first epitaxial layer in an acid solution, wherein the substrate and the carbon nanotube layer are removed from the first epitaxial layer in the acid solution at the same time, and the second epitaxial growth surface is a patterned surface defining the plurality of grooves;

directly placing a second carbon nanotube layer on the second epitaxial growth surface, wherein the second carbon nanotube layer defines a plurality of apertures, and the second epitaxial growth surface is exposed through the plurality of apertures; and growing a second epitaxial layer on the second epitaxial growth surface through the plurality of apertures, and a portion of the second epitaxial layer is embedded into the plurality of grooves.

* * * * *